United States Patent
Cheng et al.

(10) Patent No.: US 8,759,168 B2
(45) Date of Patent: Jun. 24, 2014

(54) MOSFET WITH THIN SEMICONDUCTOR CHANNEL AND EMBEDDED STRESSOR WITH ENHANCED JUNCTION ISOLATION AND METHOD OF FABRICATION

(71) Applicant: International Business Machines Corporation, Armonk, NY (US)

(72) Inventors: Kangguo Cheng, Guilderland, NY (US); Bruce B. Doris, Brewster, NY (US); Ali Khakifirooz, Slingerlands, NY (US); Pranita Kerber, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/942,942

(22) Filed: Jul. 16, 2013

(65) Prior Publication Data
US 2013/0302962 A1  Nov. 14, 2013

(51) Int. Cl.
*H01L 21/84* (2006.01)
*H01L 21/336* (2006.01)

(52) U.S. Cl.
USPC ............... 438/151; 438/300; 257/E21.431

(58) Field of Classification Search
USPC .......... 438/151, 153, 299, 300, 303; 257/347, 257/368, E21.409, E21.431
See application file for complete search history.

(56) References Cited

U.S. PATENT DOCUMENTS

| | | | |
|---|---|---|---|
| 7,037,795 B1 * | 5/2006 | Barr et al. ..................... | 438/300 |
| 7,399,663 B2 * | 7/2008 | Hoentschel et al. .......... | 438/151 |
| 2006/0255330 A1 * | 11/2006 | Chen et al. ..................... | 257/18 |
| 2008/0067557 A1 * | 3/2008 | Yu et al. ........................ | 257/255 |
| 2008/0217686 A1 * | 9/2008 | Majumdar et al. ............ | 257/347 |
| 2008/0230840 A1 * | 9/2008 | Chen et al. .................... | 257/368 |
| 2010/0038715 A1 * | 2/2010 | Babich et al. ................. | 257/347 |
| 2010/0065924 A1 * | 3/2010 | Lin et al. ....................... | 257/408 |

* cited by examiner

*Primary Examiner* — Tuan N. Quach
(74) *Attorney, Agent, or Firm* — Novak Druce Connolly Bove + Quigg LLP; Louis J. Percello, Esq.

(57) ABSTRACT

A field effect transistor structure that uses thin semiconductor on insulator channel to control the electrostatic integrity of the device. Embedded stressors are epitaxially grown in the source/drain area from a template in the silicon substrate through an opening made in the buried oxide in the source/drain region. In addition, a dielectric layer is formed between the embedded stressor and the semiconductor region under the buried oxide layer, which is located directly beneath the channel to suppress junction capacitance and leakage.

19 Claims, 8 Drawing Sheets

MOSFET WITH THIN SEMICONDUCTOR CHANNEL AND EMBEDDED STRESSOR WITH ENHANCED JUNCTION ISOLATION AND METHOD OF FABRICATION

This application is a Divisional of U.S. application Ser. No. 13/283,308, filed Oct. 27, 2011, now U.S. Pat. No. 8,575,698.

FIELD OF THE DISCLOSURE

The present disclosure relates to semiconductor devices and methods of forming thereof, which contain metal-oxide-semiconductor field-effect transistors (MOSFETs) that include a thin channel region and an embedded stressor. In particular, the present disclosure relates to thin channel regions being provided between a dielectric layer and a buried oxide layer, and, further, between embedded stressors.

BACKGROUND

The performance of semiconductor device substrates can be modified by exerting mechanical stresses. For example, hole mobility can be enhanced when the channel region is under compressive stress, while the electron mobility can be enhanced when the channel is under tensile stress. Thus, compressive and/or tensile stresses can be provided in the channel regions of a p-channel field effect transistor (pFET) and/or an n-channel field effect transistor (nFET) to enhance the performance of such devices.

Accordingly, stressed silicon channel region may be provided by forming embedded silicon germanium (SiGe) or silicon carbon (Si:C) stressors within the source and drain regions of a complementary metal oxide semiconductor (CMOS) device, which induce compressive or tensile strain in the channel region located between the source region and the drain region.

Metal Oxide Semiconductor Field Effect Transistor (MOSFET) devices with thin channels are promising candidates to provide superior device scaling for future technology nodes. However, the use of embedded stressors such as SiGe and Si:C that are used in current CMOS to boost transistor performance is not straightforward with thin-channel devices. For example, integrated embedded stressors with thin channel transistors exhibit drawbacks in terms of increased junction capacitance and leakage.

Figure 1:
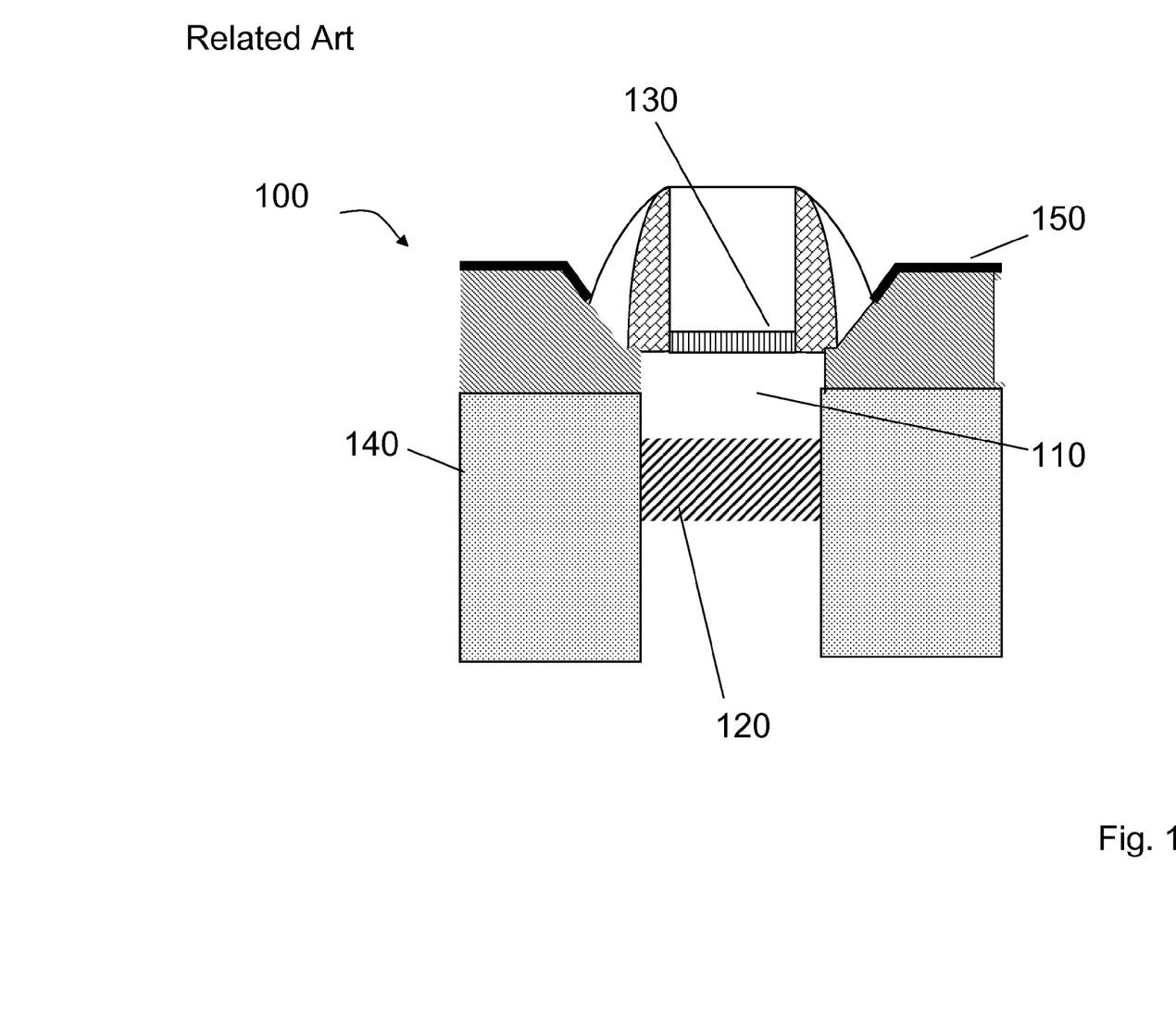
FIG. 1 shows a related art semiconductor structure 100 of a MOSFET with a thin channel region 110 located between a BOX layer 120 and a dielectric layer 130.

FIG. 1 shows a related art semiconductor structure 100 of a MOSFET with a thin channel region 110 located between a BOX layer 120 and a dielectric layer 130. To ensure that the electrostatic integrity of the device is not degraded, the embedded stressor 140 has to be either undoped or lightly doped at the bottom to allow heavier doping above the BOX. Some well doping is still required in the region below the BOX layer to prevent a possible punch-through. Also, to ensure that there is enough doped material for contact formation raised source/drain (S/D) regions are provided, which, however, leads to higher parasitic capacitance.

SUMMARY OF THE DISCLOSURE

Disclosed herein are semiconductor structures comprising a semiconductor substrate; a buried oxide (BOX) layer within the semiconductor substrate; a gate stack on the semiconductor substrate, wherein a channel region is provided between the gate stack and the buried oxide layer; a dielectric layer adjacent to the buried oxide layer; a first epitaxially-grown region adjacent to the dielectric layer; and a second epitaxially-grown region adjacent to the channel region and adjacent to the first epitaxially-grown region.

Further disclosed herein are methods of fabricating a semiconductor structure, comprising providing a semiconductor substrate; forming a buried oxide layer within the semiconductor substrate; forming a gate structure on the semiconductor substrate; defining a channel region between the gate structure and the buried oxide layer; forming a recess adjacent to the gate structure, wherein the recess extends through the buried oxide layer into the semiconductor substrate; forming a dielectric layer at a sidewall of the recess, wherein the dielectric layer at least partially covers a side of the buried oxide layer; epitaxially growing a first region within the recess; and epitaxially growing a second region on the first region.

BRIEF DESCRIPTION OF THE DRAWINGS

FIGS. 2-4 show the relevant method steps of forming the MOSFET of FIG. 5.

DESCRIPTION OF THE BEST AND VARIOUS EMBODIMENTS

The foregoing and other objects, aspects and advantages will be better understood from the following detailed description of the best and various embodiments. Throughout the various views and illustrative embodiments of the present disclosure, like reference numbers are used to designate like elements.

It will be understood that when an element or layer is referred to as being "on" another element or layer, that the elements or layers are abutting each other. While one element or layer may be above another element or layer, "on" is not limited to an element or layer being above, but may be below or on a side to the other element or layer.

In a preferred embodiment, the first epitaxially-grown region is undoped or has a dopant concentration of less than $1 \cdot 10^{18}$ atoms/cm$^3$. In another preferred embodiment, the second epitaxially-grown region has a dopant concentration of more than $1 \cdot 10^{19}$ atoms/cm$^3$.

Typically, the second epitaxially-grown region comprises Silicon Germanium (SiGe). Also typically, an amount of Germanium in the SiGe is of from 20 to 70%.

With particularity, the second epitaxially-grown region comprises Silicon Carbide (SiC). Typically, an amount of carbon in the silicon carbide is of from 0.5 to 5%. Even more typical, the amount of carbon is of from 1.5 to 2%.

In a particular embodiment, the channel region has a thickness of from 5 to 10 nm. With particularity, the buried oxide layer has a thickness of from 10 to 50 nm. Also with particularity, the second epitaxially-grown region exerts a tensile or compressive stress upon the channel region.

In another particular embodiment, the first epitaxially-grown region comprises a first dopant and the second epitaxially-grown region comprises a second dopant and wherein the first dopant and the second dopant have an opposite polarity.

Typically, the semiconductor substrate further comprises a second buried oxide layer under the first epitaxially-grown region.

With particularity, the method of fabricating a semiconductor structure comprises providing a semiconductor substrate; forming a buried oxide layer within the semiconductor substrate; forming a gate structure on the semiconductor substrate; defining a channel region between the gate structure and the buried oxide layer; forming a recess adjacent to the gate structure, wherein the recess extends through the buried oxide layer into the semiconductor substrate; forming a dielectric layer at a sidewall of the recess, wherein the dielectric layer at least partially covers a side of the buried oxide layer; epitaxially growing a first region within the recess; and epitaxially growing a second region on the first region.

Also with particularity, the forming the recess comprises dry etching. Typically, the recess has a depth of from 50 to 200 nm. Also typically, the second epitaxially-grown region exerts a uniaxial tensile or compressive stress onto the channel region.

In a typical embodiment, at least one of the forming the first epitaxially-grown region or the forming the second epitaxially-grown region comprises in-situ doping. In another typical embodiment, the forming the dielectric layer comprises pulling down an intermediate height of the dielectric layer to a final height.

Figure 2:
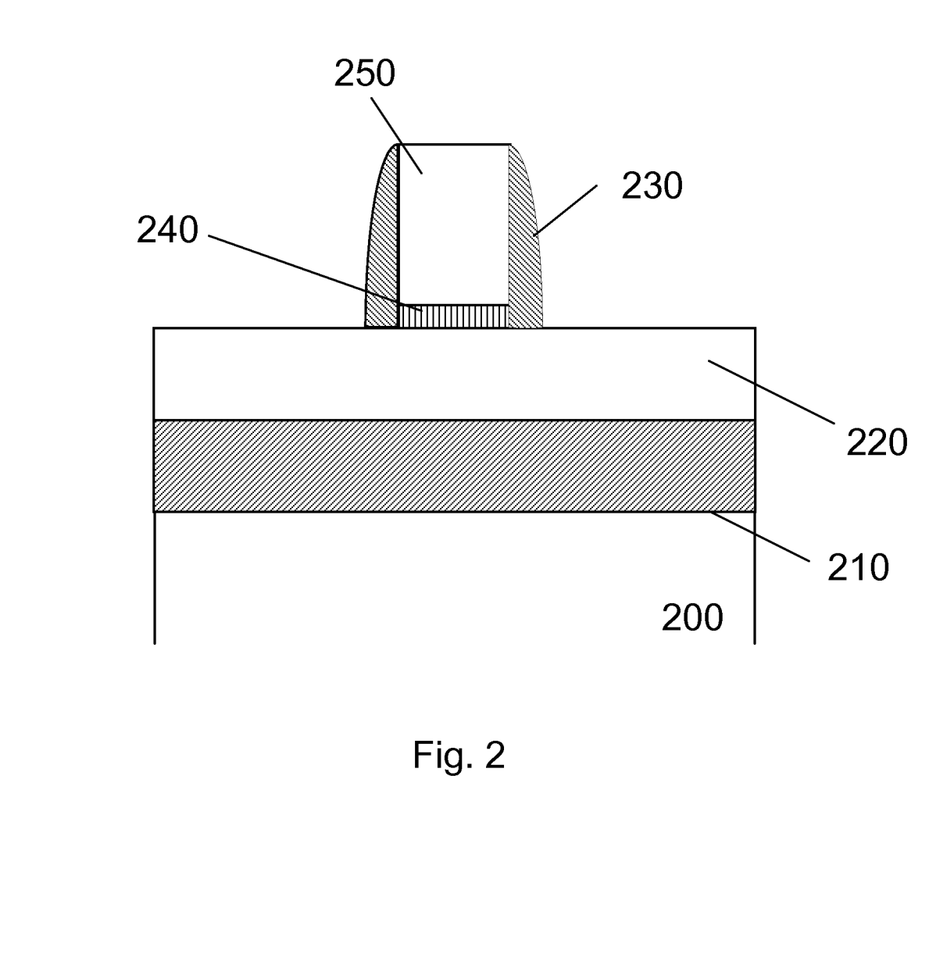
FIG. 2 shows a gate stack on semiconductor substrate 200, which comprises a BOX layer 210. The gate stack comprises gate region 250, sidewall spacers 230, and a dielectric layer 240. The thin channel region of the MOSFET will be formed in a later processing step from semiconductor material 220.
Figure 3:
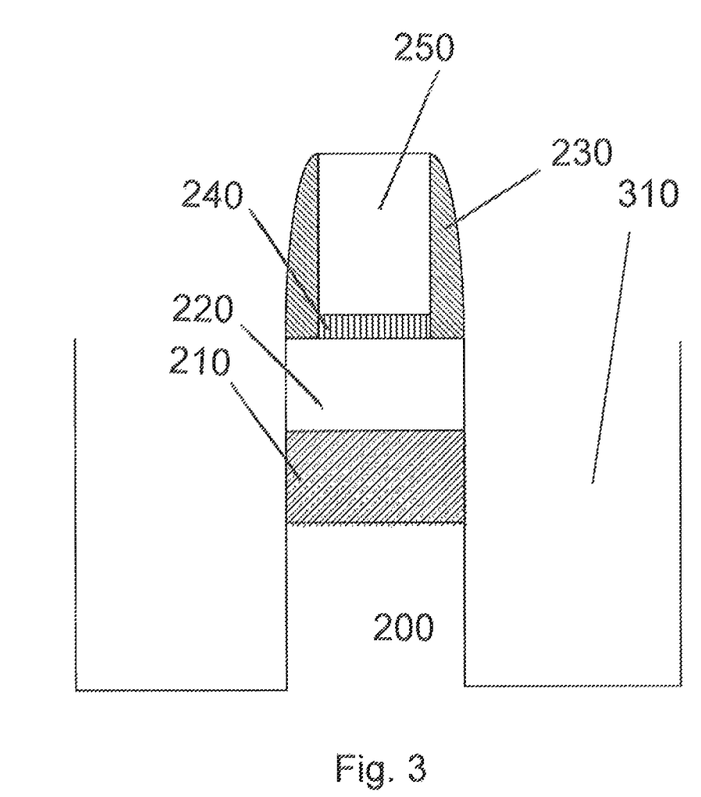
FIG. 3 shows the formation of recesses 310 within the semiconductor substrate extending through semiconductor material 220 and BOX layer 210 into semiconductor substrate 200.
Figure 4:
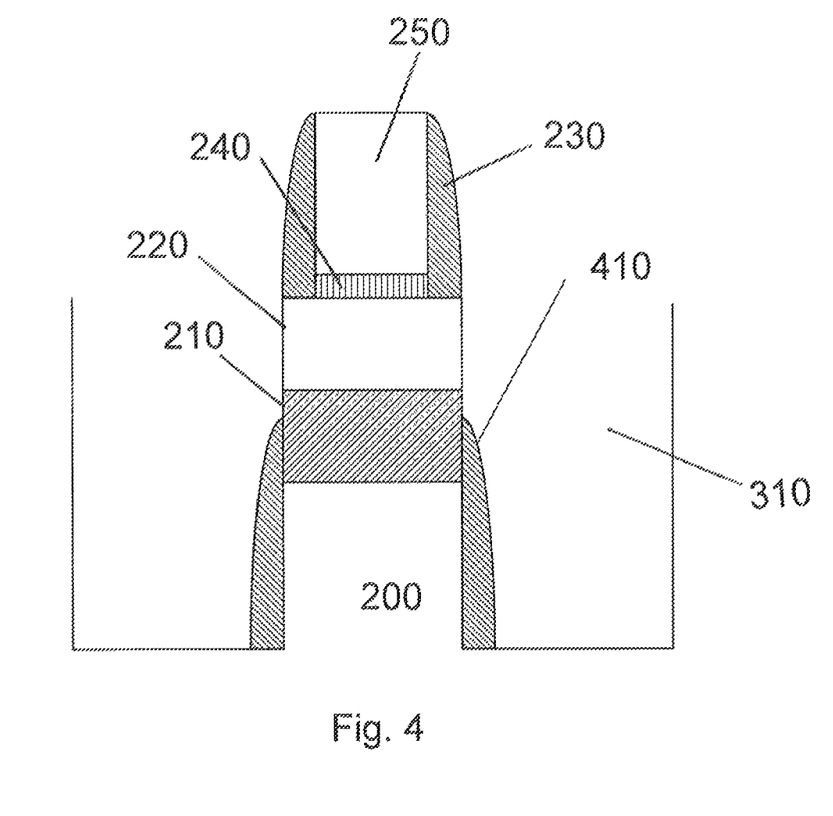
FIG. 4 shows the formation of sidewall spacers 410 within recesses 310.
Figure 5:
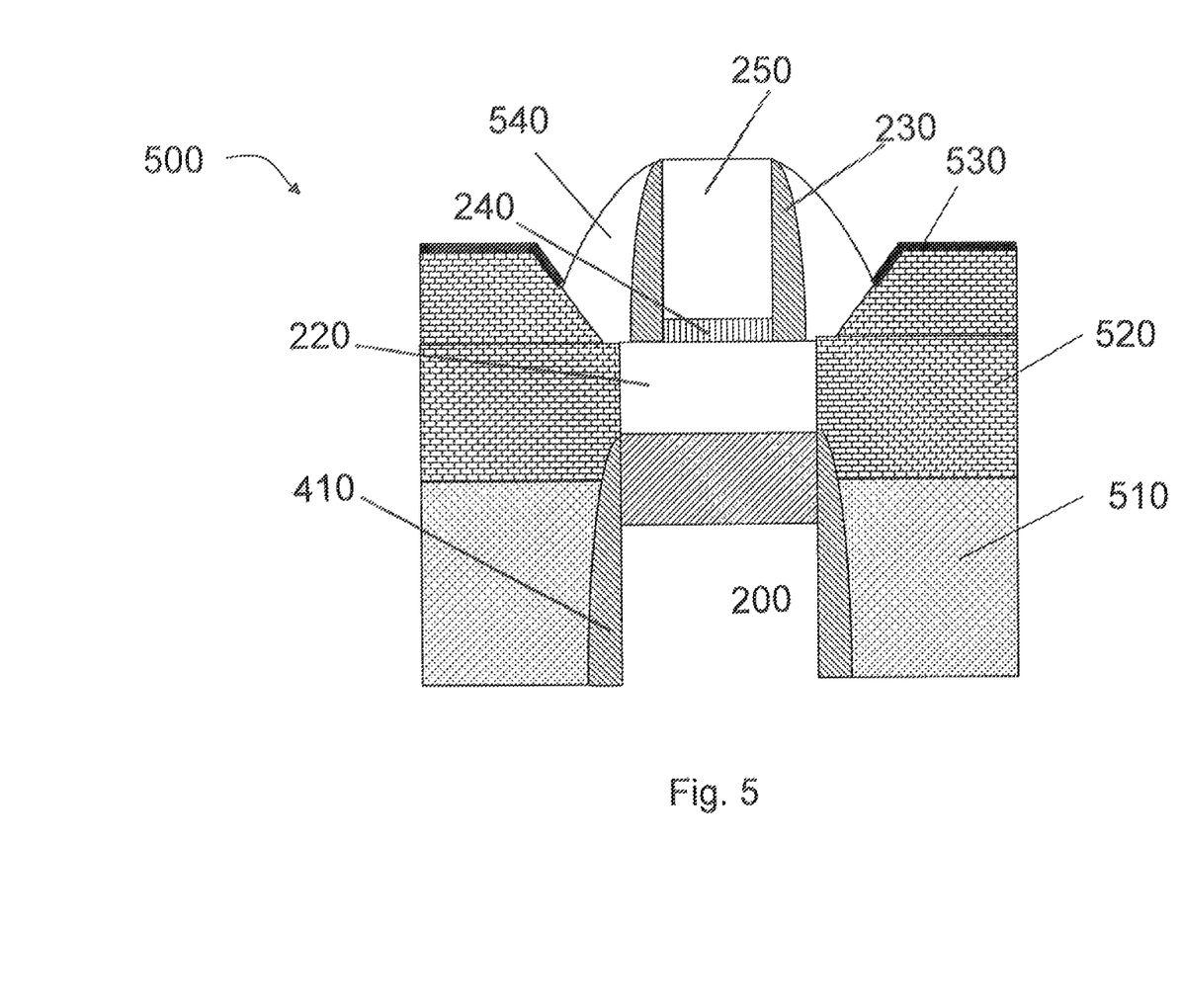
FIG. 5 shows the finished device 500, which includes a first epitaxially-grown region 510, a second epitaxially-grown region 520, a capping layer 530, and insulating region 540.

Turning to the drawings, FIGS. 2-4 show the pertinent method steps of forming the MOSFET device of FIG. 5.

Specifically, FIG. 2 shows a gate stack that has been formed on semiconductor substrate 200, which comprises a BOX layer 210. The gate stack comprises gate region 250, sidewall spacers 230, and a dielectric layer 240. The thin channel region of the MOSFET will be formed as a result of a later processing step from semiconductor material 220 in the area between the box layer 210 and the dielectric layer 240.

Semiconductor substrate 200 can be comprised of any semiconductor material including, but not limited to Si, Ge, SiGe, SiC, SiGeC, GaAs, GaN, InAs, InP and all other III/V or II/VI compound semiconductors. The semiconductor material of the semiconductor substrate 200 has a first lattice constant that is dependent on the type of semiconductor material employed. Semiconductor substrate 200 may also comprise an organic semiconductor or a layered semiconductor such as Si/SiGe, a silicon-on-insulator (SOI), a SiGe-on-insulator (SGOI) or a germanium-on-insulator (GOI). In one embodiment, semiconductor substrate 200 includes an SOI substrate in which top and bottom semiconductor material layers such as Si are spaced apart by a buried dielectric such as a buried oxide. The semiconductor substrate 200 may be doped, undoped or may contain doped and undoped regions adjacent to each other.

The gate stack comprising dielectric layer 240, sidewall spacer 230, and gate region 250 may be formed utilizing any conventional process that is well known to those skilled in the art. In a typical embodiment, the gate stack is formed by deposition of various material layers, followed by patterning the deposited material layers via lithography and etching.

The material for sidewall spacer 230 may be any dielectric material such as, for example, an oxide, a nitride, an oxynitride or any combination thereof. Preferably, sidewall spacer 230 is comprised of silicon oxide or silicon nitride.

Dielectric layer 240 includes an insulating material, such as an oxide, a nitride, an oxynitride, or a multilayer stack thereof. In one embodiment of the invention, the dielectric layer 240 is a semiconductor oxide, a semiconductor nitride or a semiconductor oxynitride. In another embodiment of the invention, the dielectric layer 240 includes a dielectric metal oxide having a dielectric constant that is greater than the dielectric constant of silicon oxide, e.g., 3.9. Typically, the dielectric layer 240 has a dielectric constant greater than 4.0, with a dielectric constant of greater than 8.0 being more typical. Such dielectric materials are referred to herein as a high k dielectric. Exemplary high k dielectrics include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high k materials can also be employed as the dielectric layer 240. Each value of x is independently from 0.5 to 3 and each value of y is independently from 0 to 2.

Dielectric layer 240 can be formed by methods known in the art. In one embodiment, the dielectric layer 240 is formed by a deposition process such as, for example, chemical vapor deposition (CVD), physical vapor deposition (PVD), molecular beam deposition (MBD), pulsed laser deposition (PLD), liquid source misted chemical deposition (LSMCD), and atomic layer deposition (ALD). Alternatively, the dielectric layer 240 can be formed by a thermal process such as, for example, thermal oxidation and/or thermal nitridation.

Gate region 250 comprises a conductive material including, but not limited to, polycrystalline silicon, polycrystalline silicon germanium, an elemental metal, (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayer thereof. In a typical embodiment, the gate electrode is comprised of a metal gate. In another typical embodiment, the gate region 250 is comprised of polycrystalline silicon.

Typically, gate region 250 is formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other deposition processes. When Si-containing materials are used as the material for gate region 250, the Si-containing materials can be doped within an appropriate dopant by utilizing either an in-situ doping deposition process or by utilizing deposition, followed by a process step such as ion implantation or gas phase doping in which the appropriate dopant is introduced into the Si-containing material. When a metal silicide is formed, a conventional silicidation process is employed.

Typically, the as deposited gate region 250 has a thickness of from 10 nm to 100 nm, with a thickness from 20 nm to 50 nm being even more typical.

Sidewall spacer 230 can be formed utilizing processes known to those skilled in the art. For example, sidewall spacer 230 can be formed by deposition of the first spacer material, followed by etching. The width of sidewall spacer 230, as measured at its base, is typically from 2 nm to 50 nm, with a width, as measured at its base, from 10 nm to 25 nm being more typical.

FIG. 3 shows the formation of recesses 310 within the semiconductor substrate extending through semiconductor material 220 and BOX layer 210 into semiconductor substrate 200.

Typically, recess 310 is formed within the semiconductor material 220 at the footprint of the gate stack and at opposite sides of the gate stack. Recess 310 may be formed utilizing an etching technique known to those skilled in the art. The gate stack and the sidewall spacer 230 serve as an etch mask during the etching process. The depth of recess 310, as measured from the top surface of the semiconductor material 220 to the bottom of the recess, is typically from 50 nm to 200 nm, from 70 nm to 100 nm being more typical.

The etching process used in forming the recess 310 includes wet etching, dry etching or a combination of wet and dry etching. In one embodiment, an anisotropic etch is employed in forming the pair of recesses 310. In another embodiment, an isotropic etch is employed in forming the pair of recesses 310. In a further embodiment, a combination of anisotropic etching and isotropic etching can be employed in forming the pair of recesses 310. When a dry etch is employed in forming the pair of recesses 310, the dry etch can include one of reactive ion etching (RIE), plasma etching, ion beam etching and laser ablation. When a wet etch is employed in forming the pair of recesses 310, the wet etch includes any chemical etchant, such as, for example, ammonium hydroxide that selectively etches the exposed active regions of the semiconductor substrate 220.

FIG. 4 shows the formation of sidewall spacers 410 within recesses 310. Initially, the sidewall spacer material is deposited such that the bottom of the well is covered. Further, the sidewall spacer is provided to a height that exceeds the height of the sidewall spacer in the final device. Subsequently to the initial deposition, the sidewall spacer material is removed from the bottom of recess 310 and pulled back from its initial height to the desired height shown in FIG. 4. The material for sidewall spacer is independently selected from the materials suitable for sidewall spacer 230, i.e., sidewall spacer 410 may be selected from any dielectric material such as, for example, an oxide, a nitride, an oxynitride or any combination thereof. Preferably, sidewall spacer 410 is comprised of silicon oxide or silicon nitride.

FIG. 5 shows a first epitaxially-grown region 510 provided within recess 310. Specifically, the first epitaxially-grown region 510 is grown to fill recess 310 to a height that is below the height of sidewall spacer 410. The material used for the first epitaxially-grown region 510 has a lattice constant that is different than the lattice constant of the remaining semiconductor substrate 220. For example, when the semiconductor substrate 220 is comprised of silicon, the first epitaxially-grown region 510 can be, for example, silicon germanium (SiGe), silicon carbon (Si:C), silicon germanium carbon (SiGeC). When a pFET is to be formed on the semiconductor substrate, the first epitaxially-grown region 510 is comprised of SiGe. When an nFET is to be formed on a semiconductor substrate, first epitaxially-grown region 510 is comprised of Si:C.

In a typical embodiment, the first epitaxially-grown region 510 is undoped, i.e., has a zero dopant concentration. In another typical embodiment, the first epitaxially-grown region 510 is lightly doped. By "lightly doped" it is meant that the first epitaxially-grown region 510 typically has a dopant concentration of less than $5 \cdot 10^{18}$ atoms/cm$^3$, with a dopant concentration of less than $1 \cdot 10^{18}$ atoms/cm$^3$ being more typical. The type of dopant that can be present within the first epitaxially-grown region 510 is dependent on the type of device to be formed. For example, when the device is a pFET, a dopant atom from Group IIIA of the Periodic Table of Elements including, for example, boron (B), aluminum (Al), indium (In), can be incorporated within the first epitaxially-grown region 510. When the device is an nFET, a dopant atom from Group VA of the Periodic Table of Elements including, for example, phosphorus (P), arsenic (As), and antimony (Sb), can be used to dope the first epitaxially-grown region 510.

The first epitaxially-grown region 510 is formed within recess 310 utilizing any epitaxial growth process known to those skilled in the art. The epitaxial growth ensures that the first epitaxially-grown region 510 is crystalline and has a same crystallographic structure as the surface of the semiconductor substrate 220 in which the first epitaxially-grown region 510 is formed. In embodiments in which the first epitaxially-grown region 510 is lightly doped, the first epitaxially-grown region 510 can be formed utilizing an in-situ doped epitaxial growth process in which the dopant atoms are incorporated into the precursor gas mixture. The types of precursors used in forming the first epitaxially-grown region 510 are well known to those skilled in the art.

Subsequently, a second epitaxially-grown region 520 is formed on an upper surface of the first epitaxially-grown region 510. The second epitaxially-grown region 520 can be comprised of the same or different, preferably the same, semiconductor material as the first epitaxially-grown region 510. The second epitaxially-grown region 520 differs however from the first epitaxially-grown region 510 in that the second epitaxially-grown region 520 has a higher dopant concentration than the first epitaxially-grown region 510. That is, the second epitaxially-grown region 520 is highly doped with respect to the first epitaxially-grown region 510. By "highly doped" is meant a dopant concentration (p-type or n-type) that is greater than $1 \cdot 10^{19}$ atoms/cm$^3$, with a dopant concentration of greater than $1 \cdot 10^{20}$ atoms/cm$^3$ being more typical.

The second epitaxially-grown region 520 is formed by a conventional epitaxial growth process including the conformal epitaxy process mentioned above with respect to the first epitaxially-grown region 510. Any known precursor can be used in forming the second epitaxially-grown region 520.

After the formation of the second epitaxially-grown region 520, insulating region 540 is applied. Typically, the material for insulating region 540 is independently selected from the materials suitable for sidewall spacer 230, i.e., an oxide, a nitride, an oxynitride or any combination thereof.

Further, capping layer 530 is formed on the second epitaxially-grown region 520. Capping layer 530 is electrically conductive and provides electrical contact to the source or drain of the MOSFET. Suitable materials for capping layer 530 are known to those skilled in the art.

Figure 6:
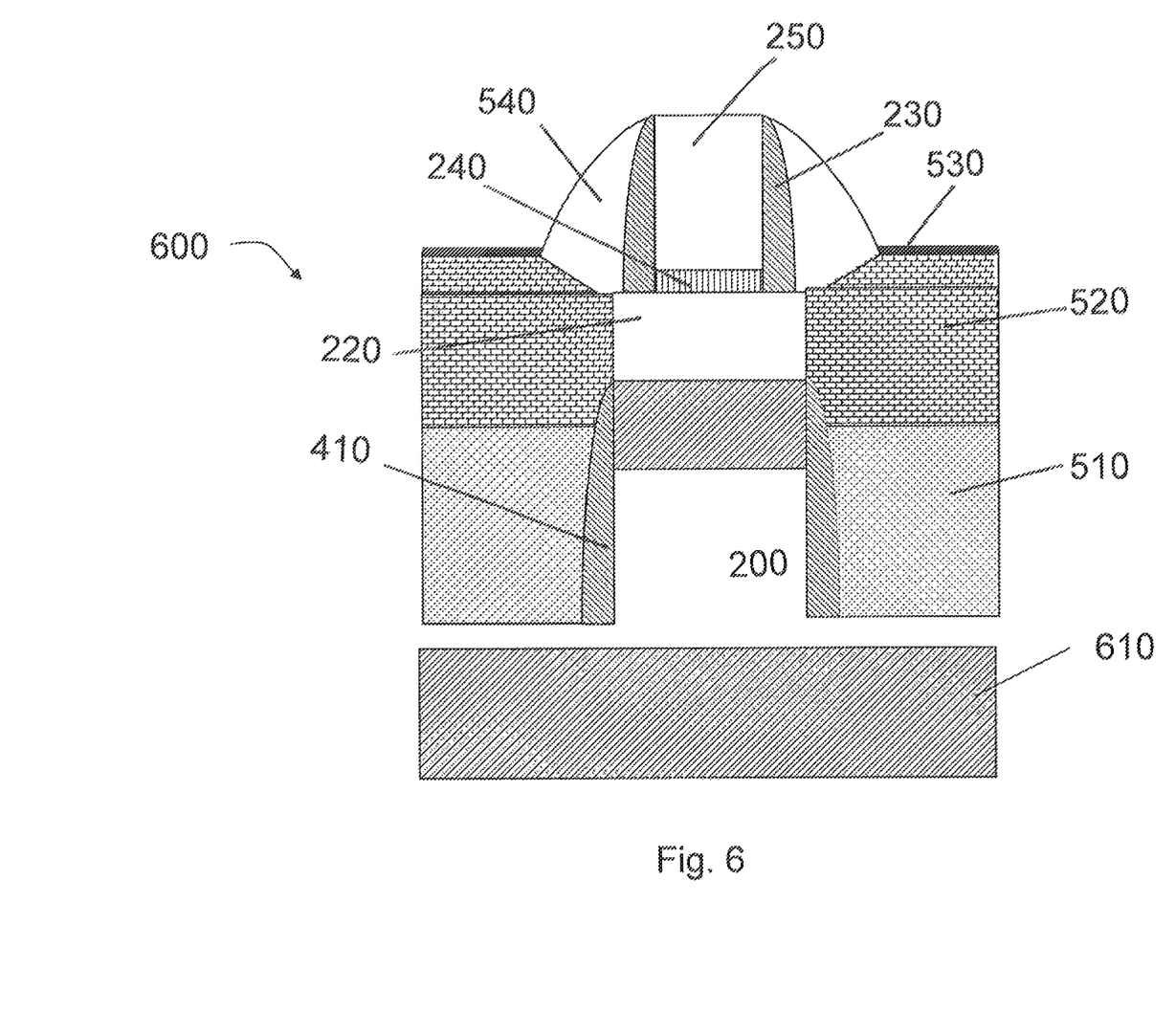
FIG. 6 shows a MOSFET device including a second BOX layer, referred to herein as a double-box structure.

FIG. 6 shows a MOSFET device including a second BOX layer, referred to herein as a double-box structure. The second BOX layer provides for additional increase in device performance by preventing current leakage and shielding the MOSFET depicted in FIG. 6 from other devices provided with the same semiconductor substrate.

Additionally, the raised S/D portion of semiconductor device 600 depicted in FIG. 6 can be made shorter than the corresponding raised S/D portion 150 in FIG. 1 because doping can start at a deeper position. It is also possible to completely avoid providing raised S/D portions for the devices disclosed herein, i.e., providing the second epitaxially-grown region to be flush with the semiconductor substrate 200. An advantage of minimizing or avoiding raised S/D portions is to reduce parasitic capacitance. Providing a lower S/D portion or avoiding the S/D portion altogether is, of course, also possible in the single box layer structure of FIG. 5 and not only in the double box structure of FIG. 6.

Figure 7:
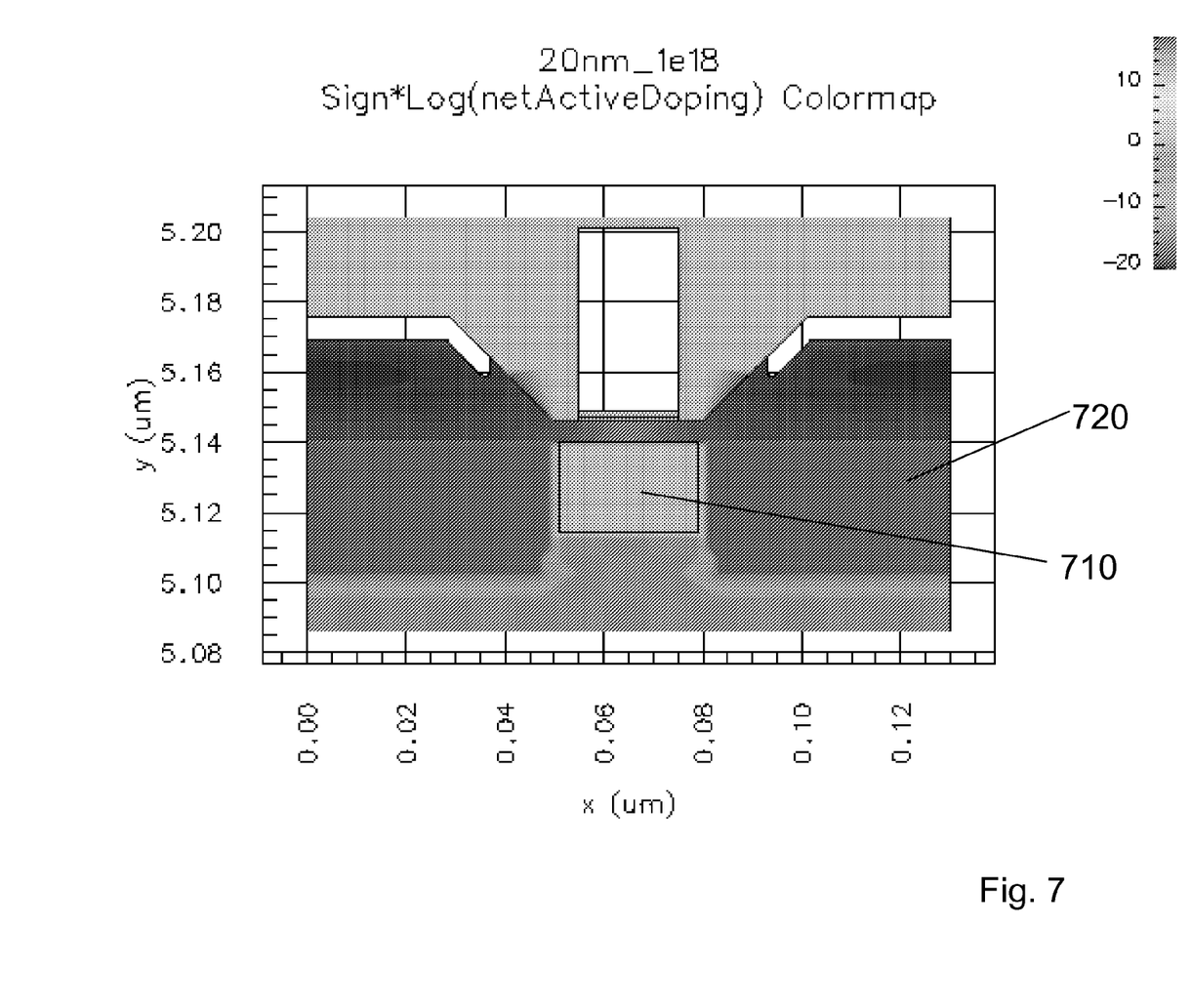
FIG. 7 shows a dopant density for the thin channel region 710 for the simulation of Id-Vg saturation curves in a semiconductor device 500.

FIG. 7 shows a device under test for varying dopant densities in the epitaxially-grown region 720. Specifically, Id-Vg saturation curves are simulated for a semiconductor device having varying dopant levels in the epitaxially-grown region. The thin channel region 710 under the gate region has a length of 20 nm.

Figure 8:
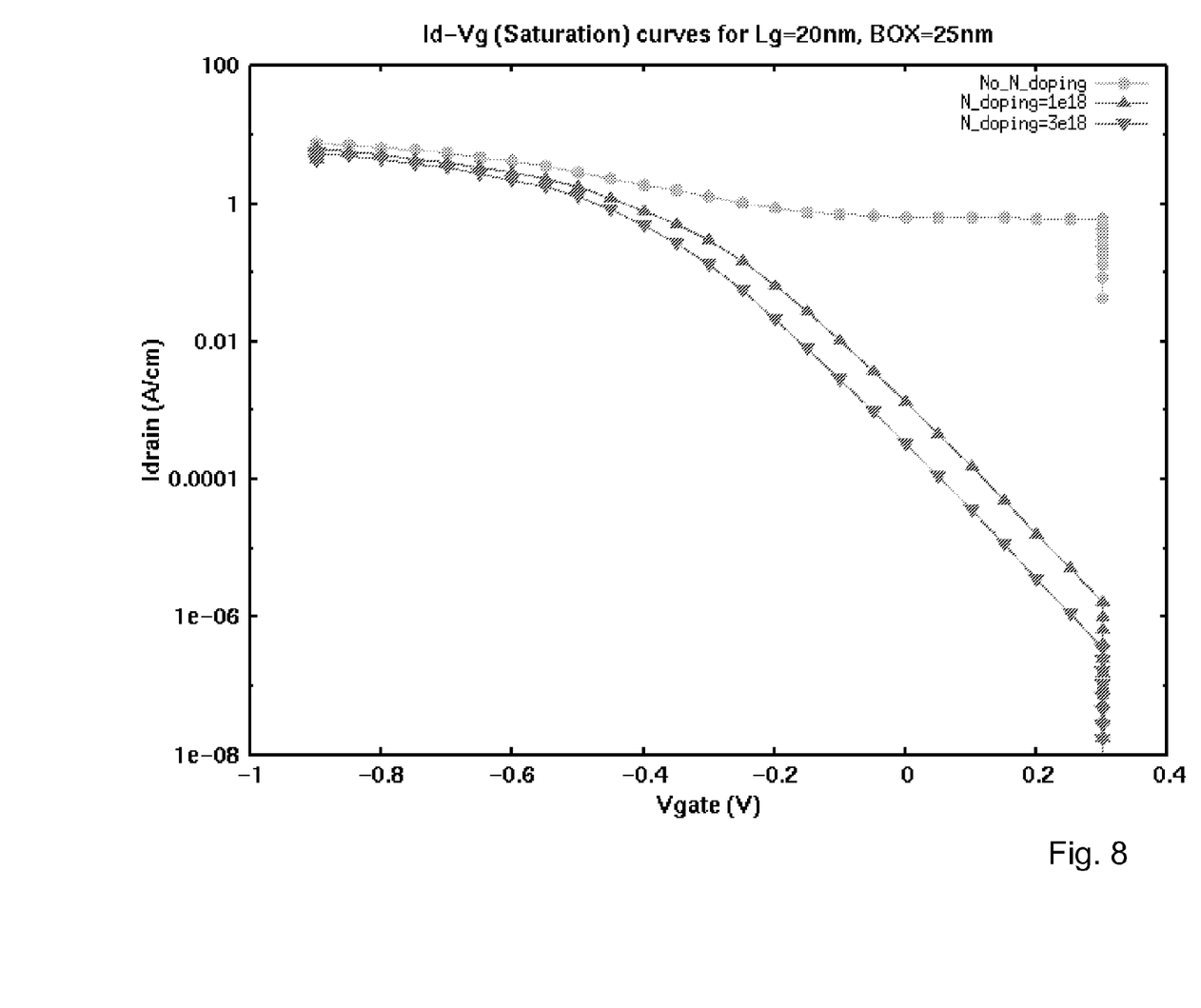
FIG. 8 shows the Id-Vg saturation curves for three different dopant concentrations (circle—no doping, upward triangle—1e18 dopants, downward triangle 3e18 dopants).

FIG. 8 shows the simulated Id-Vg saturation curves for three different dopant concentrations (circle—no doping, upward triangle—$1 \cdot 10^{18}$ dopants, downward triangle $3 \cdot 10^{18}$ dopants) of the device of FIG. 7. In the absence of dopants (line with circles), a punch-through occurs in that a leakage current flows between the source and the drain. Providing $1 \cdot 10^{18}$ dopants (line with upward triangle) reduces the punch through to a large extend. However, for practical purposes, a dopant level of $3 \cdot 10^{18}$ dopants (downward triangle) is required for preventing current leakage.

The MOSFET structure described herein uses a thin semiconductor on insulator channel to control the electrostatic integrity of the device, while embedded stressors are epitaxially grown in the source/drain area from a template in the silicon substrate through an opening made in the buried oxide in the S/D region. In addition a dielectric layer is formed between the embedded stressor and the semiconductor region under the BOX which is located directly beneath the channel to suppress junction capacitance and leakage.

The embodiments described hereinabove are further intended to explain best modes known of practicing it and to enable others skilled in the art to utilize the disclosure in such, or other, embodiments and with the various modifications required by the particular applications or uses. Accordingly, the description is not intended to limit it to the form disclosed herein. Also, it is intended that the appended claims be construed to include alternative embodiments.

The foregoing description of the disclosure illustrates and describes the present disclosure. Additionally, the disclosure shows and describes only the preferred embodiments but, as mentioned above, it is to be understood that the disclosure is capable of use in various other combinations, modifications, and environments and is capable of changes or modifications within the scope of the concept as expressed herein, commensurate with the above teachings and/or the skill or knowledge of the relevant art.

The term "comprising" (and its grammatical variations) as used herein is used in the inclusive sense of "having" or "including" and not in the exclusive sense of "consisting only of." The terms "a" and "the" as used herein are understood to encompass the plural as well as the singular.

All publications, patents and patent applications cited in this specification are herein incorporated by reference, and for any and all purpose, as if each individual publication, patent or patent application were specifically and individually indicated to be incorporated by reference. In the case of inconsistencies, the present disclosure will prevail.

What is claimed is:

1. A method of fabricating a semiconductor structure, comprising:
   providing a semiconductor substrate;
   forming a buried oxide layer having a thickness of from 10 to 50 nm within the semiconductor substrate;
   forming a gate structure on the semiconductor substrate;
   defining a channel region having a thickness of from 5 to 10 nm between the gate structure and the buried oxide layer;
   forming a recess adjacent to the gate structure,
   wherein the recess extends through the buried oxide layer into the semiconductor substrate;
   forming a dielectric layer at a sidewall of the recess,
   wherein the dielectric layer at least partially covers a side of the buried oxide layer;
   epitaxially growing a first region within the recess wherein the first region has a lattice constant different from the lattice constant of the semiconductor substrate; and
   epitaxially growing a second region on the first region:
   wherein the first region is undoped or has a dopant concentration of less than $1 \cdot 10^{18}$ atoms/cm$^3$ and the second region has a dopant concentration of more than $1 \cdot 10^{19}$ atoms/cm$^3$.

2. The method of claim 1, wherein the forming the recess comprises dry etching.

3. The method of claim 1, wherein the recess has a depth of from 50 to 200 nm.

4. The method of claim 1, wherein the second epitaxially-grown region exerts a uniaxial tensil or compressive stress onto the channel region.

5. The method of claim 1, wherein at least one of the forming the first epitaxially-grown region or the forming the second epitaxially-grown region comprises in-situ doping.

6. The method of claim 1, wherein the forming the dielectric layer comprises pulling down an intermediate height of the dielectric layer to a final height.

7. The method of claim 1, wherein the second epitaxially-grown region comprises Silicon Germanium (SiGe).

8. The method of claim 7, wherein an amount of Germanium in the SiGe is of from 20 to 70%.

9. The method of claim 1, wherein the second epitaxially-grown region comprises Silicon Carbide (SiC).

10. The method of claim 9, wherein an amount of carbon in the silicon carbide is of from 0.5 to 5%.

11. The semiconductor structure of claim 10, wherein the amount of carbon is of from 1.5 to 2%.

12. The method of claim 1, wherein the second epitaxially-grown region exerts a tensile or compressive stress upon the channel region.

13. The method of claim 1, wherein the first epitaxially-grown region comprises a first dopant and the second epitaxially-grown region comprises a second dopant and wherein the first dopant and the second dopant have an opposite polarity.

14. The method of claim 1, wherein the semiconductor substrate further comprises a second buried oxide layer under the first epitaxially-grown region.

15. The method of claim 1, which does not contain any raised source and drain regions.

16. The method of claim 1, which comprises providing raised source and drain regions that are minimized to thereby reduce parasitic capacitance.

17. The method of claim 1, wherein the gate has a thickness of 20 nm to 50 nm.

18. The method of claim 1, wherein the recess has a depth as measured from the top of the semiconductor substrate to the bottom of the recess of 70 to 100 nm.

19. The method of claim 1, wherein the second epitaxially-grown region comprises the same semiconductor material as the first epitaxially-grown region.

* * * * *